United States Patent
Chudzik et al.

(10) Patent No.: US 8,735,244 B2
(45) Date of Patent: May 27, 2014

(54) SEMICONDUCTOR DEVICE DEVOID OF AN INTERFACIAL LAYER AND METHODS OF MANUFACTURE

(75) Inventors: Michael P. Chudzik, Danbury, CT (US); Min Dai, Mahwah, NJ (US)

(73) Assignee: International Business Machines Corporation, Armonk, NY (US)

( * ) Notice: Subject to any disclaimer, the term of this patent is extended or adjusted under 35 U.S.C. 154(b) by 133 days.

(21) Appl. No.: 13/098,840

(22) Filed: May 2, 2011

(65) Prior Publication Data
US 2012/0280370 A1 Nov. 8, 2012

(51) Int. Cl.
*H01L 21/31* (2006.01)

(52) U.S. Cl.
USPC .... 438/216; 438/799; 257/632; 257/E21.625; 257/E21.639

(58) Field of Classification Search
CPC ............ H01L 21/28264; H01L 21/02178; H01L 21/02192
USPC ............... 438/799, 216; 257/632, E21.625, 257/E21.639
See application file for complete search history.

(56) References Cited

U.S. PATENT DOCUMENTS

| | | | |
|---|---|---|---|
| 5,429,998 A * | 7/1995 | Someno et al. | 501/98.1 |
| 6,444,592 B1 | 9/2002 | Ballantine et al. | |
| 6,528,374 B2 | 3/2003 | Bojarczuk, Jr. et al. | |
| 6,784,101 B1 | 8/2004 | Yu et al. | |
| 6,861,728 B2 | 3/2005 | Bojarczuk, Jr. et al. | |
| 7,754,594 B1 | 7/2010 | Chudzik et al. | |
| 7,906,174 B1 * | 3/2011 | Wu et al. | 427/248.1 |
| 2004/0043557 A1 * | 3/2004 | Haukka et al. | 438/240 |
| 2006/0240677 A1 * | 10/2006 | Horii et al. | 438/770 |
| 2007/0001241 A1 * | 1/2007 | Lim et al. | 257/410 |
| 2007/0178635 A1 * | 8/2007 | Eldridge et al. | 438/201 |
| 2008/0048216 A1 * | 2/2008 | Ye et al. | 257/288 |
| 2009/0117750 A1 | 5/2009 | OuYang et al. | |
| 2010/0244206 A1 | 9/2010 | Bu et al. | |
| 2012/0074533 A1 * | 3/2012 | Aoyama et al. | 257/632 |

OTHER PUBLICATIONS

Ogawa et al., "0.6nm-EOT high-k gate stacks with HfSiOx interfacial layer grown by solid-phase reaction between HfO2 and Si substrate", Microelectronic Engineering, vol. 84, Issues 9-10, Sep.-Oct. 2007, pp. 1861-1864.

Ando et al., "Sub-1nm EOT HfSix/HfO2 Gate Stack Using Novel Si Extrusion Process for High Performance Application", 2006 Symposium on VLSI Technology, Digest of Technical Papers, 2006 (2 pages).

Choi et al., "Extremely Scaled Gate-First High-k/Metal Gate Stack with EOT of 0.55 nm Using Novel Interfacial Layer Scavenging Techniques for 22nm Technology Node and Beyond", 2009 Symposium on VLSI Technology, 2009, pp. 138-139.

(Continued)

*Primary Examiner* — Caridad Everhart
(74) *Attorney, Agent, or Firm* — Joseph Abate; Roberts Mlotkowski Safran & Cole, P.C.

(57) ABSTRACT

A method of forming a dielectric stack devoid of an interfacial layer includes subjecting an exposed interfacial layer provided on a semiconductor material to a low pressure thermal anneal process for a predetermined time period at a temperature of about 900° C. to about 1000° C. with an inert gas purge. A semiconductor structure is also disclosed, with a dielectric stack devoid of an interfacial layer.

22 Claims, 5 Drawing Sheets

(56) References Cited

OTHER PUBLICATIONS

Ando et al., "Understanding Mobility Mechanisms in Extremely Scaled HfO2 (EOT 0.42 nm) Using Remote Interfacial Layer Scavenging Technique and Vt-tuning Dipoles with Gate-First Process", 2009 IEEE International Electron Devices Meeting (IEDM), Dec. 7-9, 2009, pp. 423-426.

Markov et al., "On the sub-nm EOT scaling of high-k gate stacks", 9th International Conference on Ultimate Integration of Silicon, ULIS 2008, Mar. 12-14, 2008, pp. 99-102.

Ragnarsson et al., "Ultra Low-EOT (5 Å) Gate-First and Gate-Last High Performance CMOS Achieved by Gate-Electrode Optimization", 2009 IEEE International Electron Devices Meeting (IEDM), Dec. 7-9, 2009, pp. 663-666.

* cited by examiner

Within lot (wafer to wafer)

SEMICONDUCTOR DEVICE DEVOID OF AN INTERFACIAL LAYER AND METHODS OF MANUFACTURE

FIELD OF THE INVENTION

The invention relates to semiconductor structures and methods of manufacture and, more particularly, to a method of forming a dielectric stack devoid or substantially devoid of an interfacial layer.

BACKGROUND

The scaling of CMOS technology provides denser and faster semiconductor devices. At the nanometer level, though, scaling is becoming ever more complex and difficult. Illustratively, to increase the integration density of semiconductor devices, the thickness of dielectric layers such as traditional $SiO_2$ needs to be reduced. However, the reduction of the thickness of $SiO_2$ layers results in diminishing reliability of the $SiO_2$ layers as gate dielectrics. Therefore, in the continuous scaling of CMOS technology, the low-k dielectric $SiO_2$ layer has been found to limit the capacitance of the semiconductor device.

Processes have thus migrated towards the use of higher-k dielectric materials in the dielectric stack. However, even the use of higher-k dielectric materials in the dielectric stack have its limitations; although, reduction of the thickness of the low-k interfacial layer (e.g., the layer between the high-k dielectric and the substrate, such as $SiO_2$ or SiON) of higher-k dielectrics can further improve the effective k value of the entire dielectric stack. The methods to reduce the thickness of the low-k interfacial layer is the key for the scaling.

By way of illustrative example, a typical starting surface for a dielectric stack is an oxide material. The oxide material can be patterned using any conventional etching techniques such as diluted hydrofluoric acid (HF). After etching, the patterned oxide undergoes standard cleaning processes to remove organic resist and other contamination. For example, in a first standard cleaning process, e.g., SC1, the oxide layer is subject to, for example, $NH_4OH$ and deionized water in addition to hydrogen peroxide ($H_2O_2$). In another standard cleaning process, e.g., SC2, any additional organic contamination and metal contamination is removed from the oxide. In this standard cleaning process, the oxide layer is subject to HCl (acid), $H_2O_2$ and deionized water.

As an alternative, the oxide layer can undergo a piranha clean, which encompasses a mixture of sulfuric acid ($H_2SO_4$) and $H_2O_2$, which cleans organic residues from a surface of the oxide and substrate. Because the mixture is a strong oxidizer, it will remove most organic matter, and it will also hydroxylate most surfaces (add OH groups), making them extremely hydrophilic (water compatible). In any of these cleaning processes, the $SiO_2$ layer (chemical oxide) will be formed after HF etching to about 5 Å to about 7 Å, which is currently the thinnest possible starting interfacial layer (IL) obtainable for scaling. The cleaning is followed by further oxidation, nitridation and annealing, which all end with a thicker interfacial layer. However, this interfacial layer will substantially decrease the effective k value of the gate dielectric stack.

There are two methods commonly used to eliminate the $SiO_2$ layer to form no interfacial layer high-k dielectric on the substrate. In the first approach, HF etch is used to remove the $SiO_2$ layer. However, there are several drawbacks by using this method. First, the surface, after HF etching, is terminated by hydrogen which is a poor surface for the deposition of a high-k film such as using CVD or ALD methods due to the inactive surface Si—H bonds. Second, the HF will affect other areas on the wafer causing structural damage or degradation. Surface reoxidation is another concern by using HF as a last processing step.

In alternative processes, the dielectric stack can be formed by depositing metal or metal oxide on the interfacial $SiO_2$ and followed by annealing at high temperature to form graded high-k dielectric. By using this method, upon annealing, silicates develop at a significant level of Si (e.g., 10-15 at %), which may reduce the capacitance of the stack. In many cases, the $SiO_2$ interfacial layer still exists after >900° C. anneal and cannot be fully graded. Further, once the metal-oxide layer is deposited, post-growth oxidation may be needed to reduce the leakage current when using metal to scavenge the $SiO_2$ interfacial layer, which will also reduce the capacitance of the stack.

Accordingly, there exists a need in the art to overcome the deficiencies and limitations described hereinabove.

SUMMARY

In a first aspect of the invention, a method of forming a dielectric stack devoid of an interfacial layer comprises subjecting an exposed interfacial layer provided on a semiconductor material to a low pressure thermal anneal process for a predetermined time period at a temperature of about 900° C. to about 1000° C. with an inert gas purge.

In another aspect of the invention, a method comprises eliminating an interfacial layer on a surface of a semiconductor material by subjecting the interfacial layer to a low pressure such as about 1.5 torr at a temperature of about 900° C. to about 1000° C. for about 10 seconds with an inert gas purge. The method further comprises forming a high-k dielectric material on the annealed surface using a low temperature deposition method.

In yet another aspect of the invention, a semiconductor structure comprises a semiconductor substrate with an active silicon layer. The semiconductor structure further comprises a dielectric stack formed on the active silicon layer. The dielectric stack is devoid of an interfacial layer and comprises a Si—O-metal bond between the active silicon layer and the dielectric stack which comprises an atomic layer deposited high-k material. The Si—O-metal bond is about 0.9 Å to about 1.2 Å, which effectively results in a zero thickness interfacial layer stack.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the semiconductor structure with a dielectric stack devoid of an interfacial layer, which comprises the structures of the present invention. In still further embodiments, a method in a computer-aided design system is provided for generating a functional design model of the semiconductor structure with a dielectric stack devoid of an interfacial layer. The method comprises generating a functional representation of the structural elements of the semiconductor structure with a dielectric stack devoid of an interfacial layer.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to a method of forming a dielectric stack devoid or substantially devoid of an interfacial layer. More specifically, the present invention is directed to a well controlled thermal process to directly reduce the starting chemical oxide (or other interfacial layer) below about 0.6 Å and preferably about 0 Å, with in situ process capability to prevent reoxidation. The process of the present invention effectively eliminates the interfacial layer (e.g., less than 0.6 Å and preferably about 0 Å) of the dielectric stack and hence provides a pure surface with minimized oxygen bond on the surface of a semiconductor substrate for further treatment to scale the interfacial layer without restriction. Also, in implementation, it is possible to have an interfacial layer free $HfO_2$ dielectric stack by using atomic layer deposition (ALD) with $HfCl_4$ and $H_2O$ as precursors, or other conventional deposition methods such as, for example, chemical vapor deposition (CVD). The approach of the present invention can also be extended to any other oxide or metal using other deposition techniques when a minimal of $SiO_x$ interfacial layer is required with in situ process capability.

Figure 1:
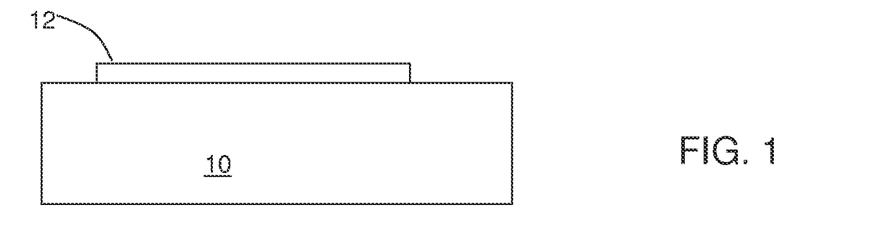
FIG. 1 shows a starting structure in accordance with aspects of the present invention.

FIG. 1 shows a starting structure in accordance with aspects of the present invention. More specifically, FIG. 1 shows a conventional interfacial layer 12 patterned on a semiconductor substrate 10. In embodiments, the semiconductor substrate 10 may comprise a bulk silicon or silicon on insulator (SOI) wafer. In the SOI implementation, the semiconductor substrate 10 comprises a semiconductor layer (e.g., active silicon) formed over an insulation layer. In the bulk silicon implementation, any isolation region or junction isolation is contemplated by the present invention.

The constituent materials of the SOI wafer may be selected based on the desired end use application of the semiconductor device. For example, the buried insulation region may be composed of oxide, such as $SiO_2$, and may be referred to as a BOX layer. Moreover, although the SOI wafer is referred to as "silicon on insulator," the semiconductor layer is not limited to silicon. Instead, the semiconductor layer may be comprised of various semiconductor materials, such as, for example, Si, SiGe, SiC, SiGeC, etc. The SOI wafer may be fabricated using techniques well known to those skilled in the art. For example, the SOI wafer may be formed by conventional processes including, but not limited to, oxygen implantation (e.g., SIMOX), wafer bonding, etc.

Still referring to FIG. 1, the interfacial layer 12 may be, for example, composed of oxide, such as $SiO_2$ or silicon oxy nitride or nitride, to provide a few examples. The interfacial layer 12 may be deposited using any known deposition method such as, for example, chemical vapor deposition (CVD) process or thermal oxidation or wet chemical oxidation.

In embodiments, the interfacial layer 12 is patterned using conventional lithographic and etching processes known to those of skill in the art. For example, the lithography step may entail applying a photoresist on the interfacial layer 12, exposing the photoresist to a pattern of radiation, and developing the pattern utilizing a conventional resist developer. Following the lithography step, a conventional etching process such as reactive-ion etching (RIE) may be employed in transferring the pattern to the interfacial layer 12 (and exposing portions of the underlying semiconductor substrate 10).

The patterned interfacial layer 12 and the exposed semiconductor substrate 10 undergo standard cleaning processes to remove organic resist and other contamination. For example, the standard cleaning process, e.g., SC1, can include, for example, $NH_4OH$ and deionized water in addition to hydrogen peroxide ($H_2O_2$). In another standard cleaning process, e.g., SC2, any additional organic contamination and metal contamination is removed from the oxide using, for example, HCl (acid), $H_2O_2$ and deionized water. The thickness of the interfacial layer 12 is initially about 5 Å to about 7 Å after cleaning and other processes steps.

Figure 2:
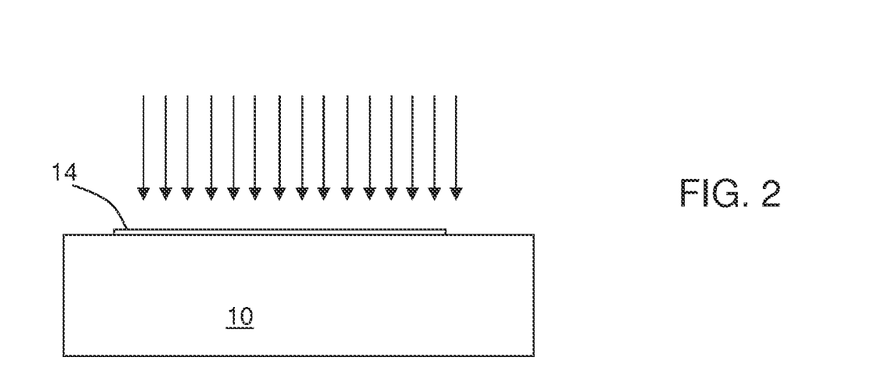
FIG. 2 shows processing steps and a related structure in accordance with aspects of the present invention.

FIG. 2 shows processing steps and a related structure in accordance with aspects of the present invention. As a starting thickness of the interfacial layer of about 5 Å to about 7 Å, in FIG. 2, the processing steps of the present invention reduces the thickness of the interfacial layer, e.g., oxide, to less than 0.6 Å and preferably about 0 Å, effectively removing the interfacial layer and creating a surface bond (film) 14. More specifically, the exposed interfacial layer and remaining portions of the structure of FIG. 2 undergo an in situ low pressure (e.g., about 1.5 torr) thermal anneal process for about 10 seconds at about 900° C. to 1000° C. with about 2000 sccm inert gas (e.g., $N_2$) purge. The processes of the present invention results in a final SiOx surface and preferably oxygen free surface (zero interface), e.g., surface bond 14, of about less than 0.6 Å and preferably about 0 Å. It should be understood that the present invention is not limited to the above conditions, in that other conditions are also contemplated by the present invention. For example, any low oxygen partial pressure environment with or without an inert purge gas is also contemplated by the present invention. In addition, the anneal is not limited to a rapid thermal anneal.

Advantageously, the surface bond 14 will not become oxidized during the processing of the present invention. Also, the processing of the present invention will result in a reactive OH terminated surface, which is preferable when forming high quality high-k films using CVD or ALD processes. This is compared to using an HF chemical etch which, for example, (i) affects other structures already formed on the semiconductor substrate 10, and (ii) results in a hydrogenated surface (H/Si) which is inactive. As should be understood by those of skill in the art, it is difficult to form high quality high-k films or other devices on a stable H/Si film due to poor nucleation.

Also, advantageously, the processes of the present invention are capable of being performed in-situ, in which only a multi-chamber tool platform is required for the processes of the present invention. That is, a subsequent ALD process and the lower pressure rapid thermal anneal process can be performed in a single tool platform without being exposed to air, which increases wafer throughput and repeatability. This is in comparison to HF chemical etching, which requires a separate type of tool for processing, as this is a wet process.

Figure 3:
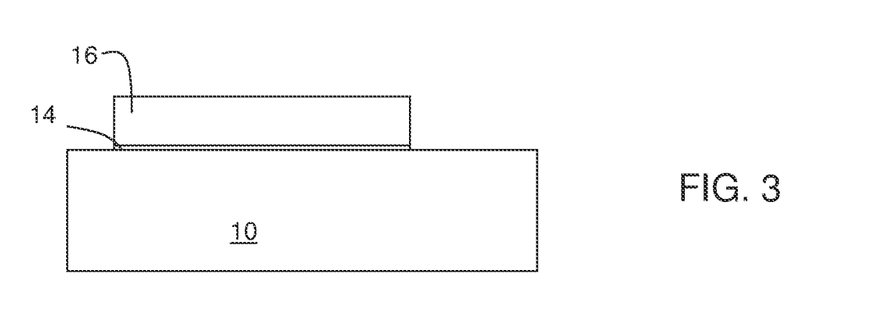
FIG. 3 shows additional processing steps and a related structure in accordance with aspects of the present invention.

FIG. 3 shows additional processing steps and a related structure in accordance with aspects of the present invention. More specifically, FIG. 3 shows a high-k dielectric film 16 deposited on the surface bond 14. In embodiments, the high-k dielectric film 16 is deposited on the surface bond 14 using, for example, ALD processes combined with low temperature (e.g., about 300° C.). In further embodiments, the high-k dielectric film 16 is $HfO_2$ deposited using $HfCl_4$ and $H_2O$ as precursors. Advantageously, the ALD process can be performed in a same chamber as the lower pressure thermal anneal process, which increases wafer throughput.

By using a highly sensitive inline XPS (X-ray photoelectron spectroscopy) technique (0.1% atomic percentage), it has been confirmed that there is no continuous formation of an Si—O layer during the ALD process combined with low temperature. Instead, it has been observed that the interfacial Hf—O—Si bond is about 0.9 Å to about 1.2 Å, which effectively results in a zero thickness interfacial layer stack. Moreover, linear correlation between $HfO_2$ thickness and ALD cycle numbers with constant deposition rate suggests there is no concern for any new interfacial layer impact on ALD growth, as discussed in more detail below. Also, as XPS confirms the existence of only a detectable amount of Si—O, it can thus be concluded that no continuous full layer of SiOx exists between the $HfO_2$ and semiconductor substrate 10; meaning the Si—O bond may be due to the interface Hf—O—Si bond between $HfO_2$ and Si of the semiconductor substrate 10.

Figure 4:
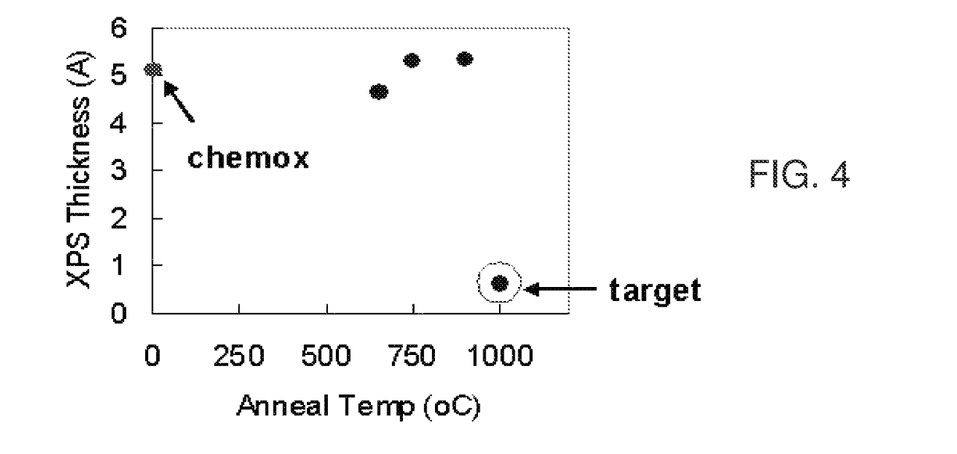
FIG. 4 shows a graph of temperature dependence for structures implementing the processes according to aspects of the present invention.

FIG. 4 shows a graph of temperature dependence for structures implementing the processes according to aspects of the present invention. More specifically, the graph of FIG. 4 shows thickness (Å) (by XPS) versus anneal temperature (° C.) in a temperature dependence study of a chemical oxide interfacial layer annealed in an $N_2$ ambient for 10 seconds. The results of this study indicate that there is a critical point between 900° C. to 1000° C., where the Si—O starts to desorb from the chemical oxide. As a result, as shown in FIG. 4, the target wafer annealed at 1000° C. shows a film thickness of less than 0.6 Å. It is more accurately described as a surface Si—O(H) bond (in which there is no interfacial layer).

Figure 5:
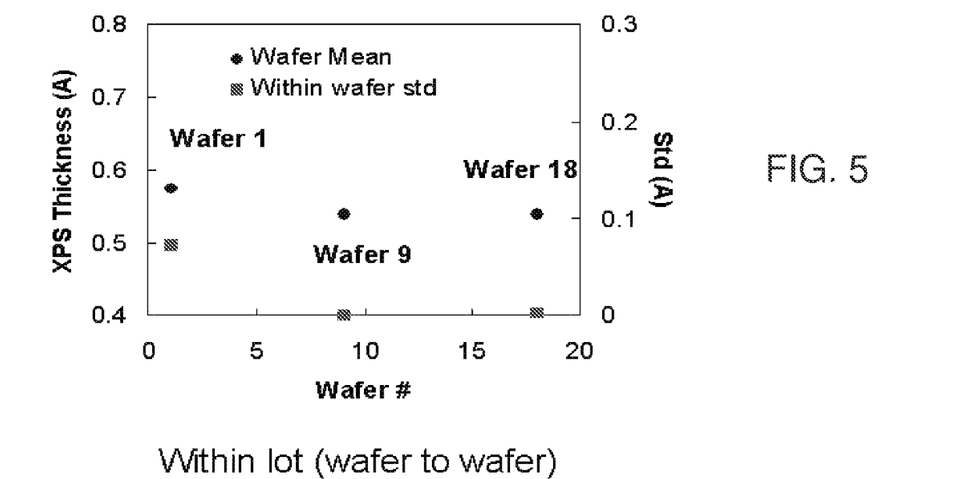
FIG. 5 shows a wafer to wafer repeatability and within wafer uniformity study for structures implementing the processes according to aspects of the present invention.

FIG. 5 shows a wafer to wafer repeatability study for structures implementing the processes according to aspects of the present invention. This graph shows thickness (Å) versus wafer number for 18 wafers processed with the same annealing recipe. In this study, the 1st, 9th and 18th wafers were measured by XPS. In the XPS measurement, the thickness of the interfacial bond showed good wafer to wafer repeatability and within wafer uniformity, i.e., all having surface Si—O bond of less than 0.6 Å.

Figure 6:
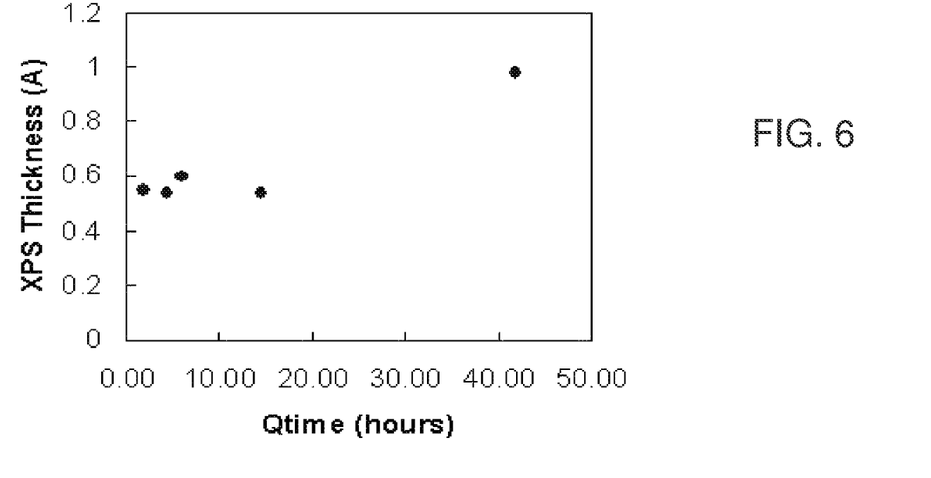
FIG. 6 shows a Q time study impact when a reduced SiOx film is exposed to ambient (air)

FIG. 6 shows a Q time study impact when the reduced SiOx film is exposed to ambient atmosphere (e.g., air). In this graph, a linear correlation between the thickness and Q time was observed for about 40 hours. As shown from this study, the interfacial film (SiOx film) thickness remains below 1 Å, and less than 0.6 Å for about 15 hours. This shows that the surface is relatively stable, over a reasonably long period of time. Accordingly, the stable surface permits subsequent processes to take place on the wafer, without concern for any thickness growth over at least a 40 hour window.

Figure 7A:
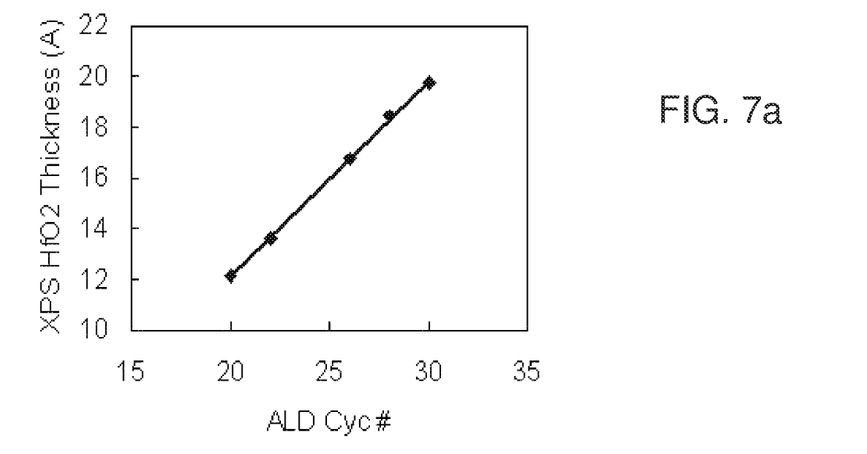
FIG. 7a shows a graph of dielectric thickness versus the number of ALD cycles, in structures implementing the processes of the present invention.
Figure 7B:
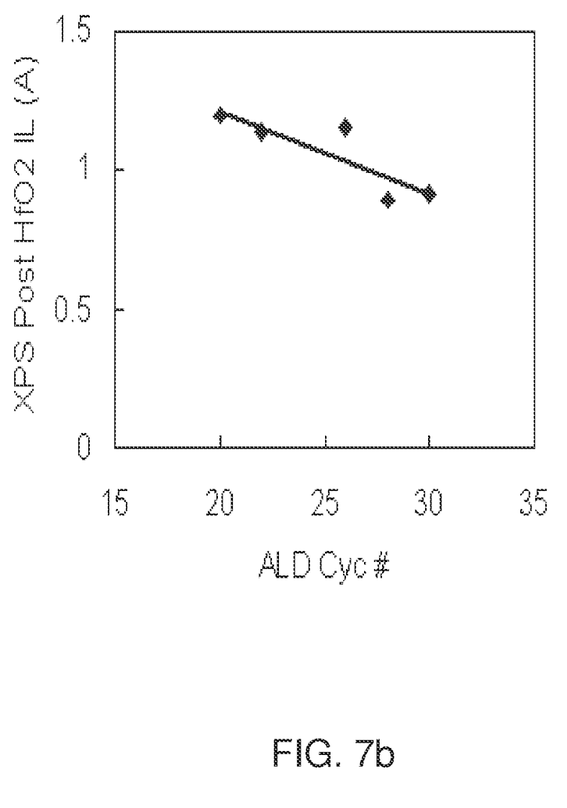
FIG. 7b shows a graph of interfacial thickness post dielectric deposition versus the number of ALD cycles, in structures implementing the processes of the present invention.

FIG. 7a shows a graph of dielectric thickness versus number of ALD cycles, in structures implementing the processes of the present invention. FIG. 7b shows a graph of interfacial thickness post dielectric deposition during a number of ALD cycles, in structures implementing the processes of the present invention. As shown in FIG. 7a, dielectric thickness of $HfO_2$ increases linearly over a number of ALD cycles, e.g., about 30 cycles. This shows that the interfacial bonding surface provides a superior surface for the ALD of $HfO_2$. FIG. 7b, on the other hand, shows only a minimal growth of a interfacial film during the ALD of $HfO_2$, which evidences an $HfO_2$ high-k stack devoid of an interfacial layer.

Figure 8:
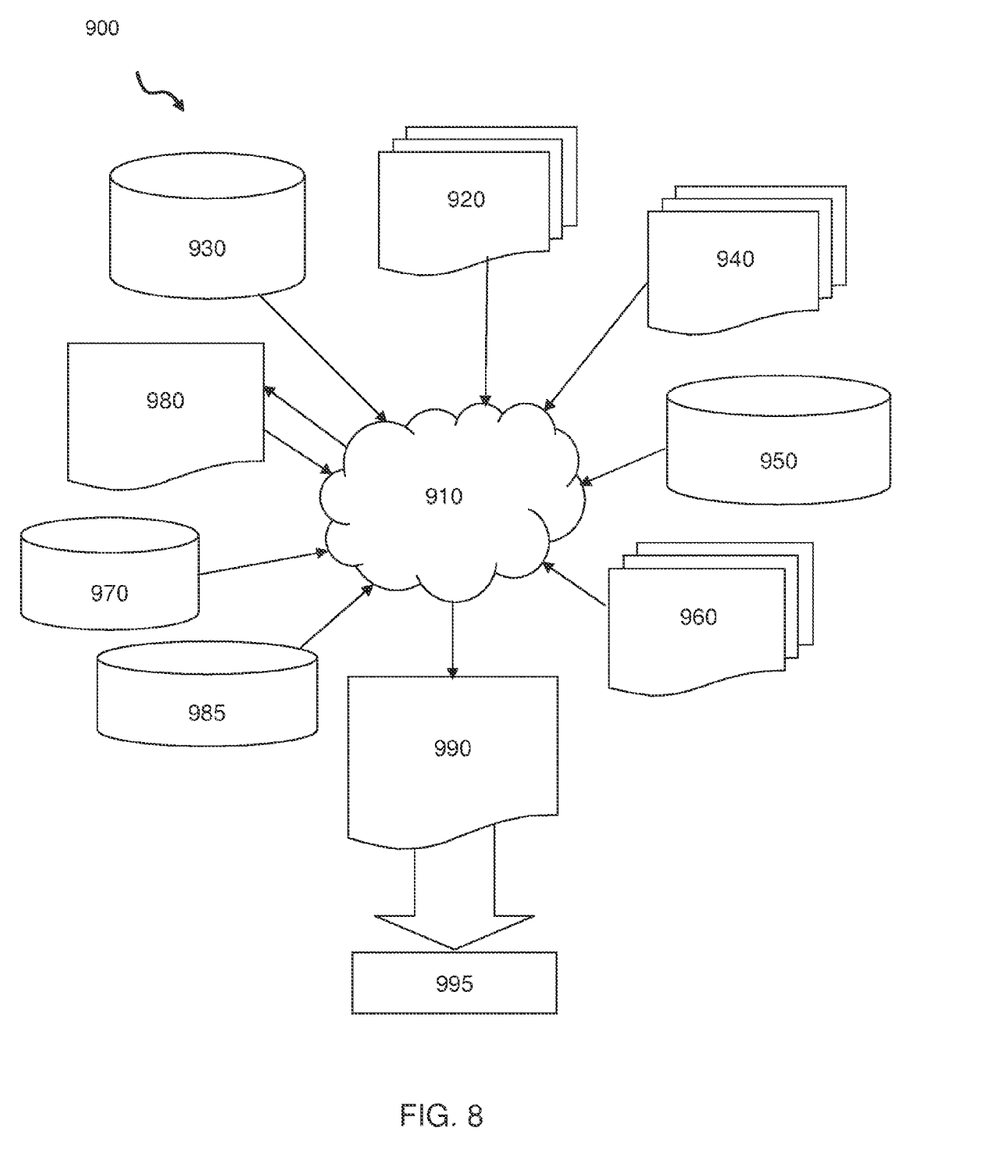
FIG. 8 is a flow diagram of a design process used in semiconductor design, manufacture, and/or test.

FIG. 8 is a flow diagram of a design process used in semiconductor design, manufacture, and/or test. FIG. 8 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-3. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example, a programmable gate array (PGA) or a field programmable gate array (FPGA) offered by Altera® Inc. or Xilinx® Inc.

FIG. 8 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-3. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-3 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-3. In one embodiment, design structure 990 may comprise a compiled, executable HDL simulation model that functionally simulates the devices shown in FIGS. 1-3.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-3. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of forming a dielectric stack devoid of an interfacial layer comprising:
   forming the interfacial layer on a substrate;
   subjecting the interfacial layer to one or more cleaning processes, wherein the interfacial layer has a thickness of about 5 Å to about 7 Å;
   subjecting the interfacial layer formed on the substrate to a low pressure thermal anneal process for a predetermined time period at a temperature of about 900° C. to about 1000° C. with an inert gas purge to reduce the thickness of the interfacial layer to about 0.6 Å or less thereby forming a bonding layer; and
   depositing dielectric material on the bonding layer to form the dielectric stack.

2. The method of claim 1, wherein:
   the annealing occurs prior to the forming of the high-k dielectric material on the annealed surface;
   the annealed surface is devoid of oxidization during subsequent processing; and
   the annealing results in transforming the interfacial layer into the bonding layer of a reactive OH terminated surface.

3. The method of claim 1, wherein the predetermined time period is about 10 seconds.

4. The method of claim 1, wherein the inert gas purge is an $N_2$ purge at about 2000 sccm.

5. The method of claim 4, wherein the predetermined time period is about 10 seconds and the low pressure is at about 1.5 torr.

6. The method of claim 5, wherein the interfacial layer is reduced to a surface oxygen bond on a surface of the substrate.

7. The method of claim 6, wherein the dielectric material is a high-k dielectric material and is deposited using a low temperature deposition.

8. The method of claim 7, wherein the low temperature deposition is an atomic layer deposition process performed at a temperature of about 300° C. and the high-k dielectric material is $HfO_2$.

9. The method of claim 8, wherein the low pressure thermal anneal process and the low temperature atomic layer deposition processes are performed in a same tool.

10. A method of forming a dielectric stack devoid of an interfacial layer comprising:
    subjecting an exposed interfacial layer provided on a semiconductor material to a low pressure thermal anneal process for a predetermined time period at a temperature of about 900° C. to about 1000° C. with an inert gas purge such that the interfacial layer is reduced to a surface oxygen bond on a surface of the semiconductor material; and
    depositing a high-k dielectric material on the surface oxygen bond using a low temperature deposition, wherein:
    the inert gas purge is an $N_2$ purge at about 2000 sccm,
    the predetermined time period is about 10 seconds and the low pressure is at about 1.5 torr,
    the interfacial layer is initially reduced to about 5 Å to about 7 Å prior to being subjected to the low pressure thermal anneal process,
    the interfacial layer is subjected to one or more cleaning processes, and
    the surface oxygen bond has a thickness of about 0.6 Å or less after the low pressure thermal anneal process.

11. A method comprising eliminating an interfacial layer on a surface of a semiconductor material by subjecting the interfacial layer to a low pressure thermal anneal process at a temperature of about 900° C. to about 1000° C. for about 10 seconds with an inert gas purge to form an interfacial oxygen bond, and forming a high-k dielectric material on the interfacial oxygen bond using a low temperature deposition process, wherein the interfacial layer is initially reduced to about 5 Å to about 7 Å prior to being subjected to the low pressure thermal anneal process and is subjected to one or more cleaning processes, and is reduced to about 0.6 Å or less after the low pressure thermal anneal process.

12. The method of claim 11, wherein the inert gas purge is an $N_2$ purge at about 2000 sccm and the interfacial layer is an oxide material.

13. The method of claim 11, wherein the interfacial oxygen bond is an Si—O bond.

14. The method of claim 11, wherein the low temperature deposition process is an atomic layer deposition process performed at a temperature of about 300° C. and the high-k dielectric material is $HfO_2$.

15. The method of claim 11, wherein the low pressure thermal anneal process and the low temperature deposition processes are performed in situ.

16. The method of claim 11, wherein the interfacial oxygen bond is devoid of oxidization during subsequent processing.

17. The method of claim 11, wherein:
    the annealing occurs on an exposed surface of the interfacial layer;
    the annealing occurs prior to the forming of the high-k dielectric material on the annealed surface;
    the annealed surface is devoid of oxidization during subsequent processing; and
    the annealing results in transforming the interfacial layer into the interfacial oxygen bond comprising a bonding layer of a reactive OH terminated surface.

18. The method of claim 11, wherein an interface of the high-k dielectric material and semiconductor material is devoid of a continuous full layer of SiOx.

19. The method of claim 18, wherein repeated cycles of atomic layer deposition does not impact growth of any new interfacial layer.

20. A method comprising eliminating an interfacial layer on a surface of a semiconductor material by subjecting the interfacial layer to a low pressure thermal anneal process at a temperature of about 900° C. to about 1000° C. for about 10 seconds with an inert gas purge to form a bonding layer, and forming a high-k dielectric material on the annealed surface using a low temperature deposition process, wherein the interfacial layer is initially reduced to about 5 Å to about 7 Å prior to being subjected to the low pressure thermal anneal process and is subjected to one or more cleaning processes, and is reduced to about 0.6 Å or less after the low pressure thermal anneal process.

21. The method of claim 11, wherein the subjecting and the forming steps are repeatable.

22. A semiconductor structure comprising:
    a semiconductor substrate with an active silicon layer; and
    a dielectric stack formed on the active silicon layer, the dielectric stack devoid of an interfacial layer and comprising an Si—O bond layer between the active silicon layer and the dielectric stack comprising an atomic layer deposited high-k material, wherein a thickness of the Si—O bond layer is about 0.6 Å or less, which results in a zero thickness interfacial layer stack.

* * * * *